United States Patent
Aruga

(10) Patent No.: US 10,608,151 B2
(45) Date of Patent: Mar. 31, 2020

(54) LIGHT SOURCE DEVICE

(71) Applicant: NICHIA CORPORATION, Anan-shi, Tokushima (JP)

(72) Inventor: Takanori Aruga, Nagano (JP)

(73) Assignee: NICHIA CORPORATION, Anan-shi (JP)

(*) Notice: Subject to any disclaimer, the term of this patent is extended or adjusted under 35 U.S.C. 154(b) by 50 days.

(21) Appl. No.: 15/388,228

(22) Filed: Dec. 22, 2016

(65) Prior Publication Data
US 2017/0184275 A1    Jun. 29, 2017

(30) Foreign Application Priority Data

Dec. 28, 2015   (JP) .................. 2015-256698
Dec. 14, 2016   (JP) .................. 2016-242475

(51) Int. Cl.
*H01L 33/58*    (2010.01)
*F21S 43/20*    (2018.01)
*F21S 43/14*    (2018.01)

(52) U.S. Cl.
CPC .............. *H01L 33/58* (2013.01); *F21S 43/14* (2018.01); *F21S 43/26* (2018.01); *G03B 2215/0567* (2013.01)

(58) Field of Classification Search
CPC . F21V 5/005; F21V 5/045; F21V 7/04; F21V 7/05; F21V 7/22; G02B 6/055; H01L 33/58; H01L 33/60
See application file for complete search history.

(56) References Cited

U.S. PATENT DOCUMENTS

| | | | | |
|---|---|---|---|---|
| 2,798,147 A | * | 7/1957 | Orsatti ............... | G09F 13/04 359/528 |
| 5,404,869 A | * | 4/1995 | Parkyn, Jr. ........... | F24S 23/31 126/699 |
| 5,500,652 A | * | 3/1996 | Huber ................. | G09F 13/16 340/815.76 |
| 2004/0201987 A1 | | 10/2004 | Omata | |
| 2010/0178046 A1 | | 7/2010 | Moon et al. | |
| 2010/0284194 A1 | * | 11/2010 | Miyashita ........... | F21V 5/04 362/311.09 |
| 2013/0194795 A1 | * | 8/2013 | Onaka ................ | F21V 5/04 362/231 |

(Continued)

FOREIGN PATENT DOCUMENTS

| | | |
|---|---|---|
| EP | 2287932 A2 | 2/2011 |
| JP | 2004-327955 A | 11/2004 |

(Continued)

OTHER PUBLICATIONS

Translation of JP2015207405.*

*Primary Examiner* — Jong-Suk (James) Lee
*Assistant Examiner* — Christopher E Dunay
(74) *Attorney, Agent, or Firm* — Global IP Counselors, LLP

(57) ABSTRACT

A light source device includes a light emitting element and a light transmissive member having a light incident surface opposite to the light emitting element, and a light emitting surface. The light incident surface includes an inner region having a retroreflective lens portion and directly facing the light emitting element, and an outer region having a shape different from a shape of the retroreflective lens.

14 Claims, 11 Drawing Sheets

(56) References Cited

U.S. PATENT DOCUMENTS

| | | | | |
|---|---|---|---|---|
| 2013/0343035 A1* | 12/2013 | Sakai | ...................... | F21V 5/045 |
| | | | | 362/84 |
| 2014/0355273 A1* | 12/2014 | Saito | ........................ | F21V 5/04 |
| | | | | 362/309 |
| 2015/0083193 A1* | 3/2015 | Ueda | ................. | H01L 31/02168 |
| | | | | 136/246 |
| 2016/0138777 A1* | 5/2016 | Shen | ....................... | F21K 9/233 |
| | | | | 362/308 |
| 2016/0223157 A1* | 8/2016 | Saito | ................. | G02B 19/0028 |
| 2017/0082261 A1* | 3/2017 | Yamada | ................. | F21V 5/008 |

FOREIGN PATENT DOCUMENTS

| | | | |
|---|---|---|---|
| JP | 2006-024615 | A | 1/2006 |
| JP | 2009-265616 | A | 11/2009 |
| JP | 2011-044610 | A | 3/2011 |
| JP | 2012-169507 | A | 9/2012 |
| JP | 2013-068751 | A | 4/2013 |
| JP | 2015-207405 | A | 11/2015 |

\* cited by examiner

LIGHT SOURCE DEVICE

CROSS-REFERENCE TO RELATED APPLICATIONS

This application claims priority to Japanese Patent Application No. 2015-256698 filed on Dec. 28, 2015 and Japanese Patent Application No. 2016-242475 filed on Dec. 14, 2016. The entire disclosures of Japanese Patent Application Nos. 2015-256698 and 2016-242475 are hereby incorporated herein by reference.

BACKGROUND

Technical Field

The present invention relates to a light source device.

Related Art

A variety of light sources have been used in electronic devices.
In recent years, light source devices have been used that make use of a light emitting diode in which a light emitting element is combined with a phosphor. Also, combination of a light emitting device and a Fresnel lens has also been proposed in order to reduce thickness of such a light source device (for example, JP2013-68751A).
With such a light source device, high brightness, high color reproduction, and so forth may be required according to applications thereof. For instance, such a device may be used as a light source device for a camera-flash, and white light is reproduced by mixing colors of light emitted from a plurality of light source devices. In this case, a phosphor covering each light source device is disposed on a side directly facing a subject, so that a screening effect required to makes it difficult to recognize a color of a phosphor layer of each of the plurality of light source devices.

SUMMARY

It is an object thereof to provide a light source device with which transmission of light from the outside can be reduced without greatly decreasing the amount of light emitted from the light emitting elements with respect to the amount of incident light, which allows for obtaining a so-called concealing effect, which is an effect of reducing visibility of individual light emitting elements disposed in the light source device or the phosphor layer disposed over the light emitting elements from outside.

A light source device according to the present disclosure includes a light emitting element and a light transmissive member having a light incident surface opposite to the light emitting element, and a light emitting surface. The light incident surface includes an inner region having a retroreflective lens portion and directly facing the light emitting element, and an outer region having a shape different from a shape of the retroreflective lens.

With this light source device of the present disclosure, without greatly decreasing the amount of light emitted from the light emitting elements with respect to the amount of incident light, a so-called concealing effect can be obtained, that is, visibility of individual light emitting elements disposed in the light source device or the phosphor layer disposed over the light emitting elements from outside can be reduced, while ensuring efficient optical characteristics.

DETAILED DESCRIPTION OF EMBODIMENTS

Embodiments for implementing the light emitting device of the present invention will be described below with reference to the accompanying drawings.
In the following embodiment of the light emitting device that embody the technological concept of the present invention are just examples, and unless otherwise specified, the constituent parts discussed in the embodiments are not intended to limit the scope of the present invention.

Further, constitutions described in examples and the embodiments can be employed in other examples and embodiments.

The sizes and the arrangement relationships of the members in each of drawings are occasionally shown exaggerated for ease of explanation.

Embodiment 1: Light Source Device

Figure 1A:
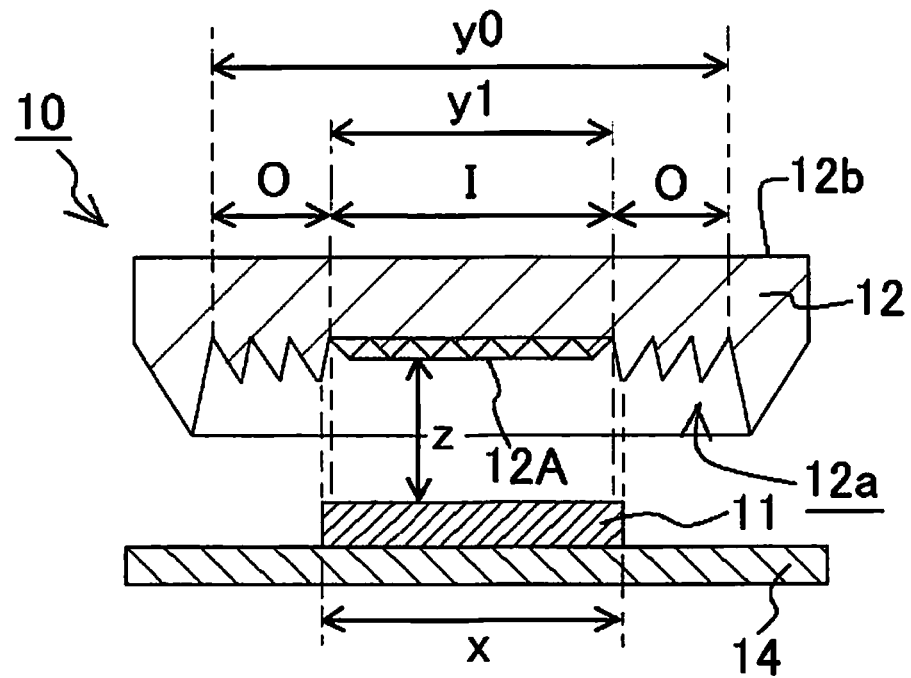
FIG. 1A is a schematic cross sectional view of the light source device in a first embodiment of the present invention.

As shown in FIG. 1A, the light source device 10 in this embodiment includes a light emitting element 11 and a light transmissive member 12. This light source device 10 includes one light emitting element 11.

Light Transmissive Member

Figure 1B:
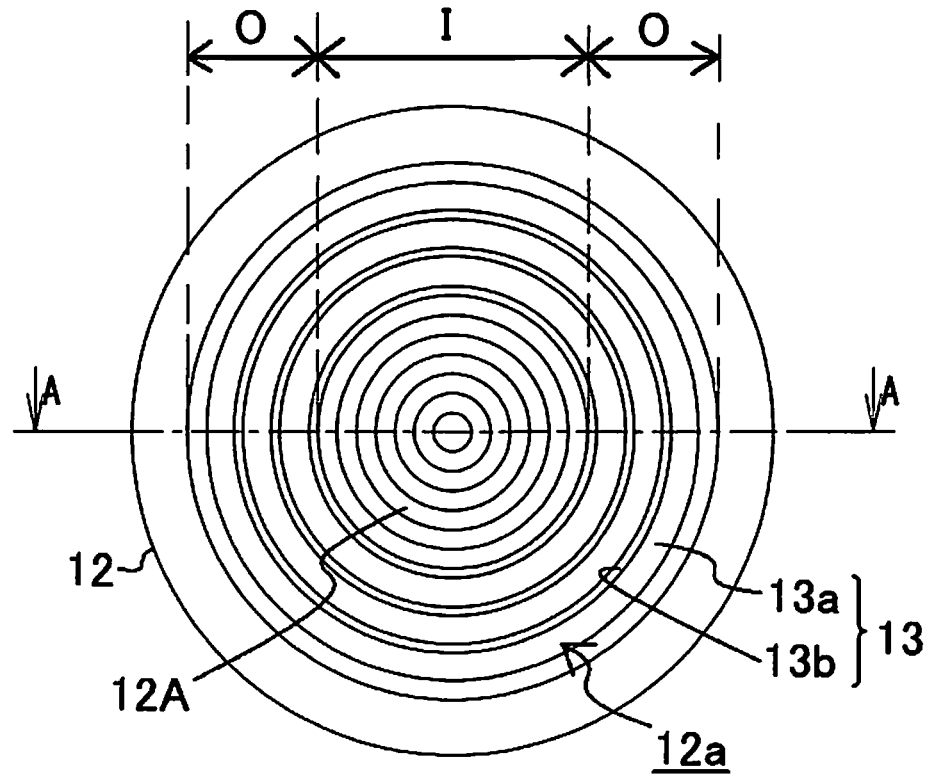
FIG. 1B is a schematic plan view of the light transmissive member in the light source device in FIG. 1A.
Figure 1C:
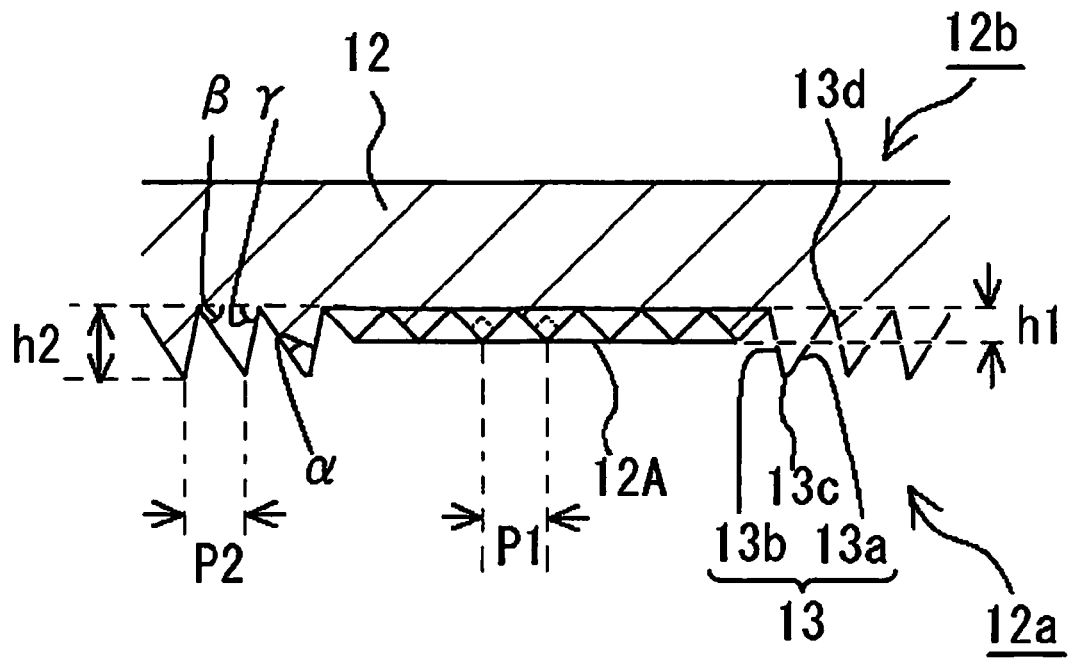
FIG. 1C is a schematic cross sectional view along the A-A' line of in FIG. 1B.

As shown in FIGS. 1A to 1C, the light transmissive member 12 has a light incidence surface 12a and a light emission surface 12b. The light incidence surface 12a refers to a face that faces the light emitting element 11 and where light emitted from the light emitting element 11 is incident. Light entered from the light incidence surface 12a is emitted from the light emission surface 12b to a side opposite to the light incidence surface 12a (that is, to the outside).

Also, the light transmissive member 12 includes an inner region I having a retroreflective lens portion 12A and directly facing the light emitting element 11, and an outer region O having a shape different from that of the retroreflective lens portion 12A. The expression "directly facing" as used here refers to being disposed to face the light emitting element, while the entire region in which the emission surface of the light emitting element (the length of one side or the diameter: x in FIG. 1A) is projected onto the light transmissive member (hereinafter referred to simply as the "projection region") may not necessarily face the inner region I. For example, all or a part of the projection region may coincide with all or a part of the inner region I, or an outer edge of the projection region may be located inside of the outer edge of the inner region I, or the outer edge of the projection region may be located outside of the outer edge of the inner region I.

The light transmissive member 12 has any appropriate outer shape in plan view, and may have a quadrangular or some other polygonal shape, or may be circular or elliptical. However, the region of the light transmissive member other than its inner region and outer region, such as a portion located further outside than the outer region, can be referred to as a flange portion and utilized for attachment of the light transmissive member 12, etc., and this part may have any appropriate shape.

Inner Region I

The planar shape of the inner region I (the shape seen from the light incidence surface side) can be, for example, circular, elliptical, polygonal, a portion of one of these shapes, a combination of these shapes, or any of various other shapes. Circular shape is particularly preferable. The inner region I can have any appropriate size according to a size of the light emitting element to be used.

For example, a diameter or length (y1 in FIG. 1A) of the inner region is the same as or smaller than the maximum diameter x (hereinafter referred to simply as the diameter x of the emission surface) or the maximum length of one side of the emission surface of the light emitting element. That is, examples of the size of the inner region I include a size that satisfies y1≤x. However, in the case of a light source device in which a plurality of light emitting elements are disposed, the size can be selected in view of the diameter or length of one side of the light emitting elements or the spacing between them, according to the number or arrangement of the light emitting elements.

The retroreflective lens portion 12A refers to a lens portion that serves to return light incident on the light emission surface (which is the opposite side from the light source) back toward the light emission surface. The performance of this retroreflection can be determined as set forth in JIS Z 8714:1995, for example. The retroreflective lens portion 12A may employ a known shape to achieve this performance. Examples such a shape include protrusions arranged concentrically circular in plan view each having an angle of 90 degrees in cross sectional view (see FIG. 1, for example), full-corner cube prisms (i.e., irregularities that consists of a plurality of rhombuses in plan view each defining a 90-degree angle with respect to an adjacent rhombus; see FIG. 2, for example), a half-corner cube prism (i.e., a convex shape consisting of a plurality of isosceles triangles in plan view, in which the apexes of three isosceles triangles meets at a single point; see FIG. 3, for example), a stripe shape in plan view, and protrusions having a stripe shape in plan view and having an angle of 90 degrees in a cross sectional view (see FIG. 4, for example). The layout and size of the protrusions and irregularities can be adjusted as needed. These shapes configured to function as a retroreflective lens may be combined with shapes that does not configured to function as a retroreflective lens. Examples of shapes that does not configured to function as a retroreflective lens include a flat surface shape and a roughened surface shape. In particular, when the retroreflective lens portion has a protruding shape of a 90-degree prism, the retroreflective lens portion preferably has a ring-like prism surface. The "90 degrees" here encompasses not only a precise degree, and allows difference of about ±10 degrees or about ±5 degrees, and the part defining the 90 degrees may be rounded off slightly. In the case where a retroreflective lens portion is combined with a shape that does not configured to function as a retroreflective lens, the retroreflective lens portion preferably has an area that is 50% or greater, more preferably 70% or greater of the planar surface area of the inner region.

In FIGS. 1A to 1C, the shape is such that a plurality of concentric circular prism surfaces are continuously linked. Therefore, each surface of the prism surfaces meets at 90-degree angles with adjacent surface, and their height (h1 in FIG. 1C) can be appropriately adjusted according to the size of the light emitting element being used, the size of the light source device to be obtained, or the like. For example the height is in arrange of about 25 to 150 μm. The pitch (P1 in FIG. 1C) between each of the prism surfaces can be appropriately selected according to the height h1. Here, h1 is 75 μm and the pitch P1 is 150 μm, for example. The portions where the prism surfaces are linked may be rounded.

The maximum thickness in the inner region I is about 0.1 to 10 mm, for example, and preferably about 0.5 to 5 mm.

Figure 7:
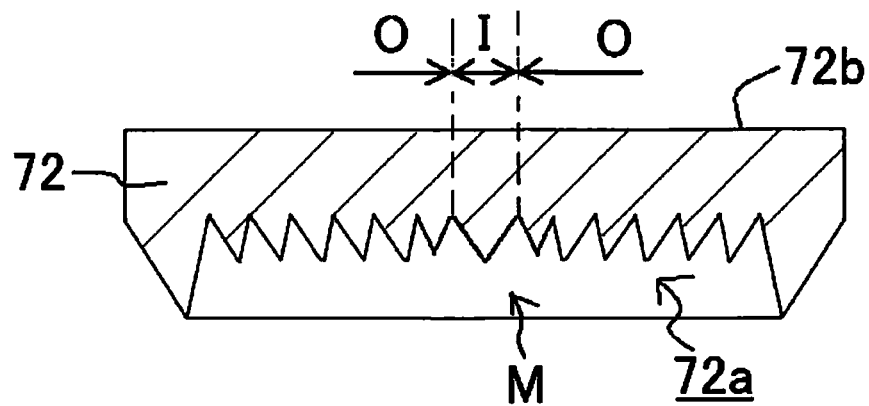
FIG. 7 is a schematic plan view of the light transmissive member in the light source device in the first embodiment of the present invention.
Figure 8:
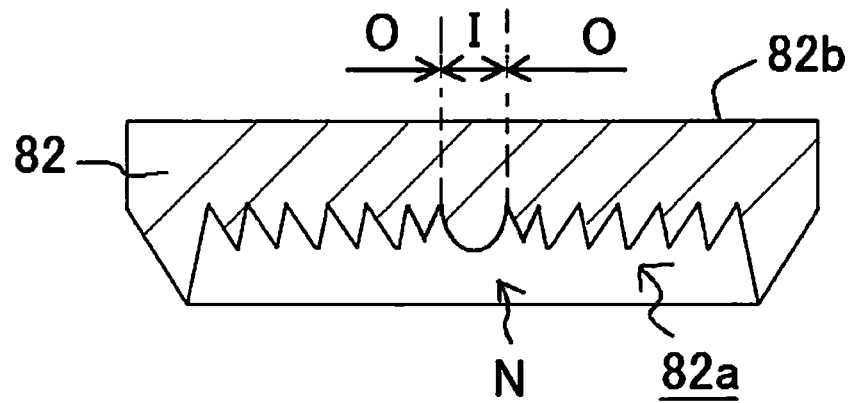
FIG. 8 is a schematic plan view of the light transmissive member in the light source device in the first embodiment of the present invention.

As shown in FIG. 7, for example, the retroreflective lens portion may have a shape of a cone (indicated by M in FIGS. 7 and 9) that is convex toward the light emitting element (the distal end of the cone may be slightly rounded), or as shown in FIG. 8, may have a shape of a portion of a sphere (indicated by N in FIG. 8) that is convex toward the light emitting element. The convex conical shape and the convex partial spherical shape may be disposed at any location of the retroreflective lens portion, but are preferably disposed near the center, for example. The phrase "near the center" here means at the center of the retroreflective lens portion or near the center.

Figure 1D:
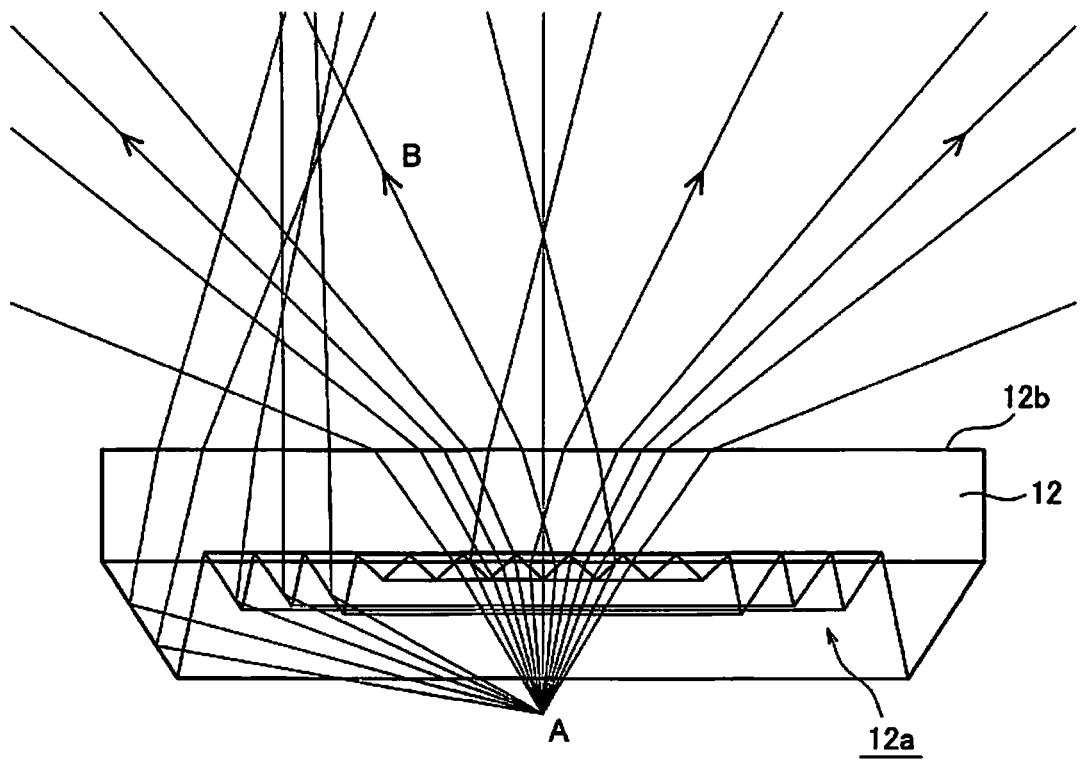
FIG. 1D is a schematic cross sectional view illustrating the path of a light beam in the light transmissive member in FIG. 1B.

As shown in FIG. 1D, in the inner region I, when light entered from the light incidence surface 12a side of the light transmissive member (light from the light source; see A in FIG. 1D) strikes the retroreflective lens portion, the light advances not as parallel light, but in a direction near 60 degrees (see B in FIG. 1D) away from near 0 degrees outward (when the front face direction is 0 degrees). That is, light illuminates a region in the vicinity of a region of 0 degrees of a Fresnel lens portion at an outer periphery. Thus, the amount of light emitted from the light emitting element with respect to the amount of incident light is not greatly decreased. On the other hand, external light (such as sunlight) incident from the light emission surface 12b side of the light transmissive member is repeatedly reflected by the retroreflective lens portion on the light incidence surface 12a side, and then returning to where the incident external light came from. In this inner region I, when this light source device is viewed from the outside, as discussed below, a concealing effect, which is an effect that allows the color of the light emitting element or the phosphor layer disposed over the light emitting element to be hardly recognized.

Outer Region O

The outer region O may be disposed with the outer region therebetween O in one direction, for example, but preferably is disposed surrounding the entire periphery of the inner region I.

The outer region O can have a various shape such as a circular, elliptical, polygonal, a portion of one of these shapes, or a combination of these shapes, as a shape including the inner region I. Among these, a circular shape is particularly preferable. In the case where a plurality of inner regions are present, a shape in which a plurality of circles surrounding these inner regions are linked is preferable.

The light incidence surface of the outer region has any appropriate shape that is different from that of the retroreflective lens portion, but examples thereof include a flat surface shape, irregularities, a roughened shape, and various lens shapes. In particular, it is preferable to employ a Fresnel lens shape.

More specifically, as shown in FIGS. 1A to 1C, the light transmissive member 12 has a Fresnel lens portion consisting of a plurality of unit Fresnel lens segments 13 arranged in the circumferential direction of the inner region I as the outer region O, on the outside of the retroreflective lens portion 12A in the light incidence surface 12a. In this Fresnel lens portion, the unit Fresnel lens segments 13 are disposed along concentric circles or concentric ellipses. Consequently, the outer region O functions as a Fresnel lens.

The unit Fresnel lens segments 13 includes lens surfaces 13a and rise surfaces 13b each located between the lens surfaces 13a. The lens surfaces 13a and the rise surfaces 13b are each linked at a convex vertice portion 13c and a concave vertice portion 13d, where the lens surface 13a and the rise surface 13b may define an acute angle, or the acute angles may be rounded. In particular, rounded convex vertice portions 13c allows for easily scattering light, which can enhance the concealing effect. In this Specification, the angle of a unit Fresnel lens segment 13 at the protruding vertice portion 13c where a lens surface 13a and a rise surfaces 13b are linked is called the Fresnel angle α.

The lens surfaces 13a and the rise surfaces 13b may be such that the cross sectional shape shown in FIG. 1C is linear, or curved convexly or concavely to the inside.

The maximum thickness within the unit Fresnel lens segments 13 in the outer region O of the light transmissive member 12 is, for example, about 0.1 to 10 mm, and preferably about 0.5 to 5 mm.

The maximum diameter or length (y0 in FIG. 1A) of the outer region O including the inner region I is preferably, for example, two times to five times as large as the diameter or the length of one side of the emission surface of the light emitting element used in the light source device.

In the case where the outer region O is a Fresnel lens, ensuring a large projection surface area of the rise surfaces enhances the concealing effect. More specifically, the ratio of the rise surfaces to the lens surfaces (rise surfaces/lens surfaces) may be greater than 1.

Also, in this embodiment, with a great the ratio of the area of the outer region O in the light transmissive member, more specifically, with arrangement of the light emitting element not only below the inner region I but also below a portion of the outer region O on the inner region I side, the amount of light emitted from the outer region O (emitted light amount) with respect to the amount of light incident on the outer region O from the light emitting element (incident light amount) is not greatly decreased, and when the light source device is observed from the light emission surface side, concealing effect, which allows the color of the light emitting element or of the phosphor layer disposed over the light emitting element to be hardly recognized.

The light transmissive member 12 can be manufactured by a known manufacturing method, from materials known in this field. Resin and glass are examples of such material. This material may contain a light scattering material or the like. Examples of light scattering materials include glass fiber, wollastonite, and other fibrous fillers, aluminum nitride, carbon, and other inorganic fillers, silica, titanium oxide, zirconium oxide, magnesium oxide, glass, phosphor crystals or a sintered phosphor, and sinters consisting of a phosphor and an inorganic binder.

A protective film, a reflective film, an anti-reflective film, or the like may be formed over the light incidence surface 12a and/or the light emission surface 12b of the light transmissive member 12.

For example, an anti-reflective film can have a four-layer structure made of silicon dioxide and zirconium dioxide. This improves the light emission efficiency from the light emitting element, while reducing the transmission of light from the outside, maximizing the concealing effect.

The light transmissive member 12 is preferably flat or substantially flat, so that the light emission surface 12b can be disposed parallel to the emission surface of the light emitting element 11, but may have random recesses and/or protrusions. These recesses and/or protrusions are lower or shallower than the height of the unit Fresnel lens segments 13 on the light incidence surface 12a, that is, the height or depth constituted by the lens surfaces 13a and the rise surfaces 13b. In other words, "recesses and/or protrusions" refers to fine texturing produced by roughening or matte finishing. More specifically, this can be formed by sandblasting, shot blasting (centrifugal blasting), or other such physical processing, or by chemical processing through etching with a solvent, for example. It is particularly preferable for the light emission surface of the light transmissive member 12 to be roughened.

A shape such as this allows the emitted light to be scattered uniformly.

Examples of the method for manufacturing the light transmissive member 12 include injection molding, precision grinding, laser working, and various other methods.

Light Emitting Element

The light emitting element 11 preferably has at least a nitride semiconductor laminate. This nitride semiconductor laminate is produced by laminating a first semiconductor layer (such as an n-type semiconductor layer), an emission layer, and a second semiconductor layer (such as a p-type semiconductor layer) in that order, and participates in light emission. The thickness of the nitride semiconductor laminate is preferably no more than about 30 μm. The nitride semiconductor laminate may or may not have a substrate, such as a sapphire ($Al_2O_3$) substrate on which semiconductor layers can be epitaxially grown.

The first semiconductor layer and the second semiconductor layer may be of any appropriate kind or may be made of any appropriate materials, and examples thereof include Group III-V compound semiconductors, Group II-IV compound semiconductors, and various other such semiconductors. More specifically, an example is a nitride-based semiconductor material such as $In_XAl_YGa_{1-X-Y}N$ ($0 \leq X$, $0 \leq Y$, $X+Y \leq 1$), and InN, AlN, GaN, InGaN, AlGaN, InGaAlN, or the like can be used. The thickness of the layers and the layer structure can be those that are known in this field.

The size of the light emitting element can be suitably adjusted according to the size of the light transmissive member with which it is combined, for example. The outer edge of the light emitting element, for instance, is preferably of a size that allows the outer edge to be located in the outer region O of the light transmissive member. In other words, the light emitting element preferably has a size that allows the light emitting element to be disposed not only under the inner region I of the light transmissive member 12 but extending to under a portion of the inner region I side of the outer region O. More specifically, the diameter x of the emission surface is from 0.9 to 2.9 mm, for example. With such a size, miniaturization of the light transmissive member can be achieved, and further reduction in size and thickness of a light emitting device can be achieved.

Regardless of the presence of a semiconductor growth substrate, the thickness of the light emitting element 11 including electrodes is preferably 200 μm or less, and more preferably the thickness of the nitride semiconductor laminate is 20 μm or less.

As shown in FIG. 1A, the light emitting element 11 is preferably flip-chip mounted to a mounting board 14. With this arrangement, as discussed above, the face on the opposite side from the face where the first and second electrodes are connected can function as the emission surface over its entire surface.

One light emitting element may be mounted on the substrate, or two or more may be mounted. The size, shape, and emission wavelength of the light emitting element can be suitably selected. In the case that two or more light emitting elements are mounted, their layout may be irregular, or they may be disposed periodically or regularly in a matrix or the like. The light emitting elements may be connected in series, in parallel, in series-parallel, or in parallel-series.

Disposition of Light Emitting Element and Light Transmissive Member

As discussed above, the light emitting element 11 is disposed opposite the light incidence surface 12a of the light transmissive member 12.

The center (or center of gravity) of the light emitting element 11 may be disposed so as not to coincide with the center (or center of gravity) of the inner region I of the light transmissive member 12. That is, it may be offset from the center of the inner region I of the light transmissive member 12, but it is preferably disposed so as to coincide.

The shortest distance z between the light emitting element and the inner region I of the light incidence surface 12a of the light transmissive member is preferably no more than one-half the diameter x of the emission surface of the light emitting element. From this standpoint, an example of the shortest distance z is no more than ¼ the lengthy or maximum diameter of the outer region O including the inner region I. More specifically, the shortest distance z is in a range of 0.2 to 1.0 mm, for example.

In an embodiment, the diameter x of the emission surface is no more than one-half the maximum length y0 or the maximum diameter of the outer region O including the inner region I, and the shortest distance z between the light emitting element and the inner region I of the light transmissive member 12 is no more than one-half the diameter x of the emission surface and/or no more than ¼ the maximum length y0 or the maximum diameter of the outer region O including the inner region I.

Furthermore, it is preferable that the diameter x of the emission surface is 0.65 to 2.0 mm, the maximum length y0 or the maximum diameter of the outer region O including the inner region I is 1.5 to 5.0 mm, and the shortest distance z between the light emitting element and the inner region of the light transmissive member is 0.2 to 1.0 mm.

In the case that the retroreflective lens portion has a protruding shape such as shown in FIG. 1A, etc., the pitch P1 thereof can be suitably adjusted according to the size of the light emitting element to be used, the size of the light source device to be obtained, and so forth. For example, the spacing W1 is about 0.05 to 0.4 mm, for example. The height of the convex part is about 0.025 to 0.2 mm, for example.

Phosphor Layer

A phosphor layer is preferably disposed over the emission surface of the light emitting element 11.

The phosphor layer preferably contains a phosphor configured to convert the wavelength of the light from the light emitting element. In particular, in the case where the phosphor color of yellow, orange, red, etc., is recognized, the so-called concealing effect of this embodiment can be effectively obtained.

In the case where a phosphor layer is disposed over the emission surface of the light emitting element, in this specification the shortest distance z between the light emitting element and the inner region I (discussed below) refers to the shortest distance between the upper surface of the phosphor layer and the inner region I of the light transmissive member 12.

For the phosphor, any phosphor known in this field can be used. For example, it may be a yttrium/aluminum/garnet (YAG) phosphor that is activated with cerium, a (lutetium/aluminum/garnet (LAG) phosphor that is activated with cerium, a nitrogen-containing calcium aluminosilicate ($CaO-Al_2O_3-SiO_2$) phosphor that is activated with europium and/or chromium, a silicate (($Sr,Ba)_2SiO_4$) phosphor that is activated with europium, a β-SiAlON phosphor, a CASN or SCASN phosphor, or other such nitride phosphor, a KSF phosphor ($K_2SiF_6$:Mn), a sulfide phosphor, so-called nano crystals, or a light emitting substance called quantum dots. Examples of light emitting substances include semiconductor materials such as Group II-VI, III-V, and IV-VI semiconductors, and more specifically CdSe, core/shell $CdS_xSe_{1-x}$/ZnS, GaP, and other such nano-size highly dispersible particles.

The phosphor layer preferably transmits at least 60% of the light emitted from the light emitting layer, more preferably transmits at least 75%, and most preferably transmits at least 90%.

The phosphor layer can be formed, for example, from a thermosetting resin, a thermoplastic resin, modified versions of these resins, hybrid resins containing one or more types of these resins, or the like. More specifically, examples include epoxy/modified epoxy resin, silicone/modified silicone/hybrid silicone resin, polyimide (PI), modified polyimide resin, polyamide (PA), polyethylene terephthalate resin, and polybutylene terephthalate (BPT).

The phosphor layer may contains a filler (such as a diffusion agent or a colorant). Examples include silica, titanium oxide, zirconium oxide, magnesium oxide, glass, phosphor crystals or a sintered phosphor, and sinters consisting of a phosphor and an inorganic binder.

The phosphor layer may have any appropriate thickness, and examples thereof includes a thickness of about 1 to 300 μm, preferably about 10 to 250 μm, more preferably about 10 to 200 μm. In other words, the thickness of the phosphor layer can be, for example, 5 to 10%, preferably 6 to 7%, of the maximum length y0 or the maximum diameter of the outer region O including the inner region I. Alternatively, the thickness can be equal to or less than the shortest distance z between the light emitting element and the light transmissive member, and preferably 20 to 100% of the shortest distance z.

Sealing Member

The light emitting element is preferably covered by a sealing member, which is a member serving to seal (cover) part of lateral surfaces of the light emitting element or to fix the light emitting element to a substrate. The sealing member can be made of ceramic, resin, a dielectric, pulp, glass, compound materials of these, or the like. Of these, the resins listed above are preferable in view of ease of molding into desired shape.

Embodiment 2: Light Source Device

Figure 2A:
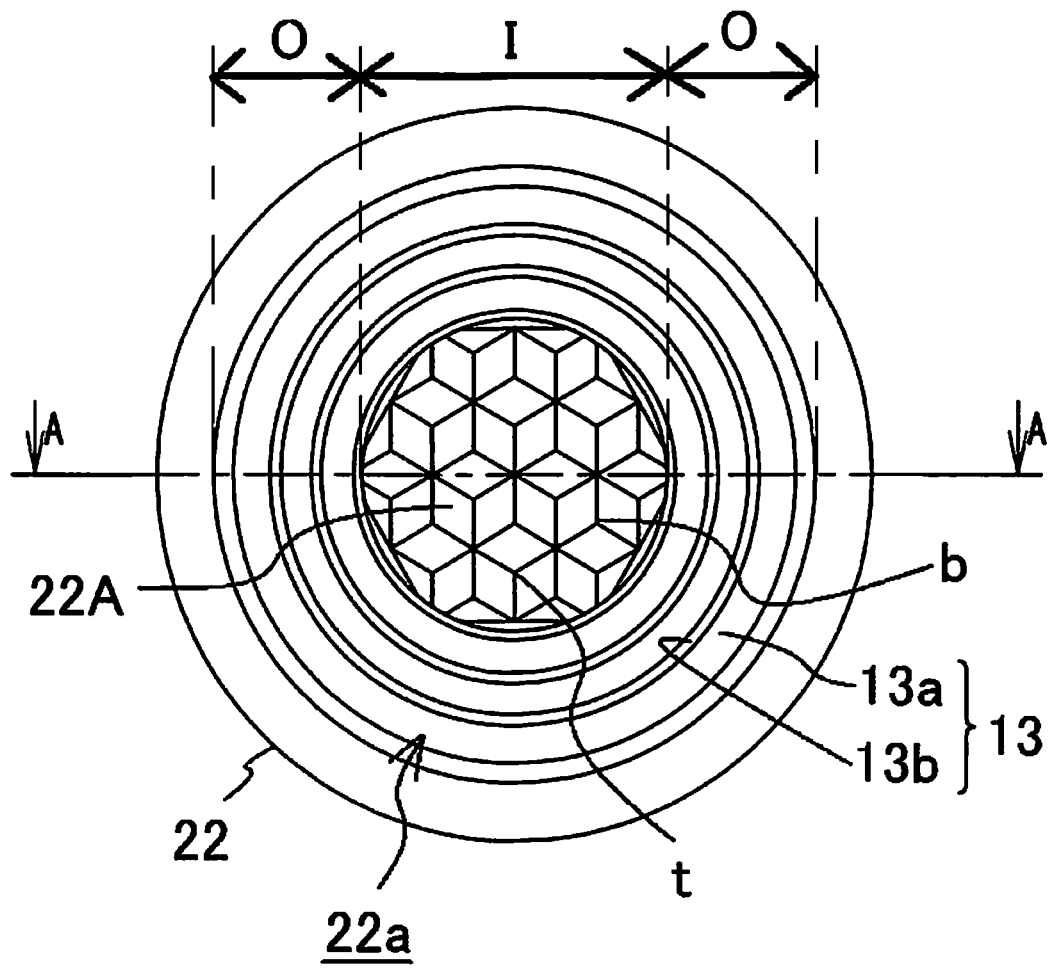
FIG. 2A is a schematic plan view of the light transmissive member in the light source device in a second embodiment of the present invention.
Figure 2B:
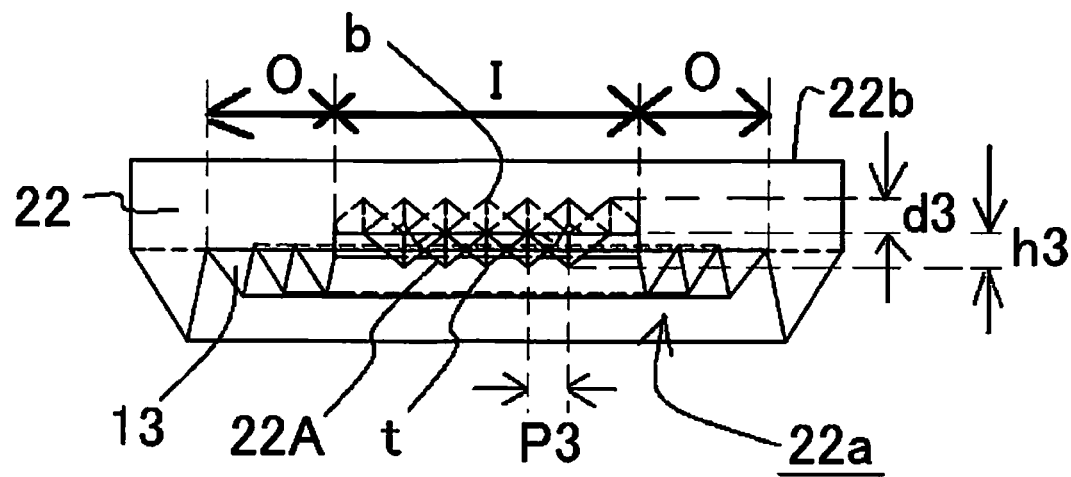
FIG. 2B is a schematic cross sectional view along the A-A' line in FIG. 2A.
Figure 2C:
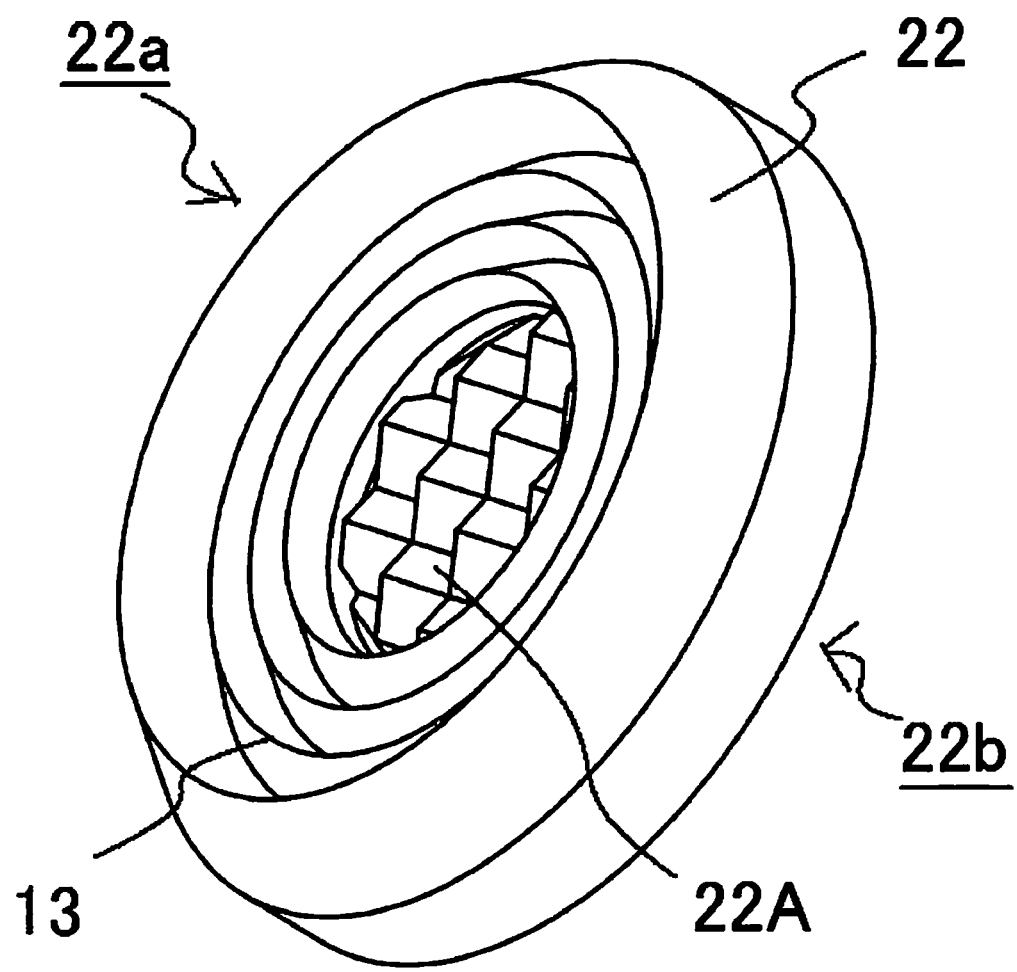
FIG. 2C is a schematic oblique view of the light transmissive member in FIG. 2A.

As shown in FIGS. 2A to 2C, the light source device in this embodiment has substantially the same configuration as the light source device 10 in Embodiment 1, except that the surface shape of a retroreflective lens portion 22A is a corner cube concave/convex shape. The effect is therefore the same as that of the light source device 10.

In the case that the shape of the retroreflective lens portion 22A is that of a full-corner cube prism (a convex/concave shape that consists of a plurality of rhombuses in plan view, with each rhombus forming a 90-degree angle to an adjacent rhombus), the length of one side thereof, for example, can be suitably adjusted according to the size of the light emitting element to be used, the size of the light source device to be obtained, and so forth. For instance, the pitch P3 of the convex parts and concave parts is about 0.1 to 0.4 mm. Therefore, the length of one side is about 0.12 to 0.49 mm.

Embodiment 3: Light Source Device

Figure 3A:
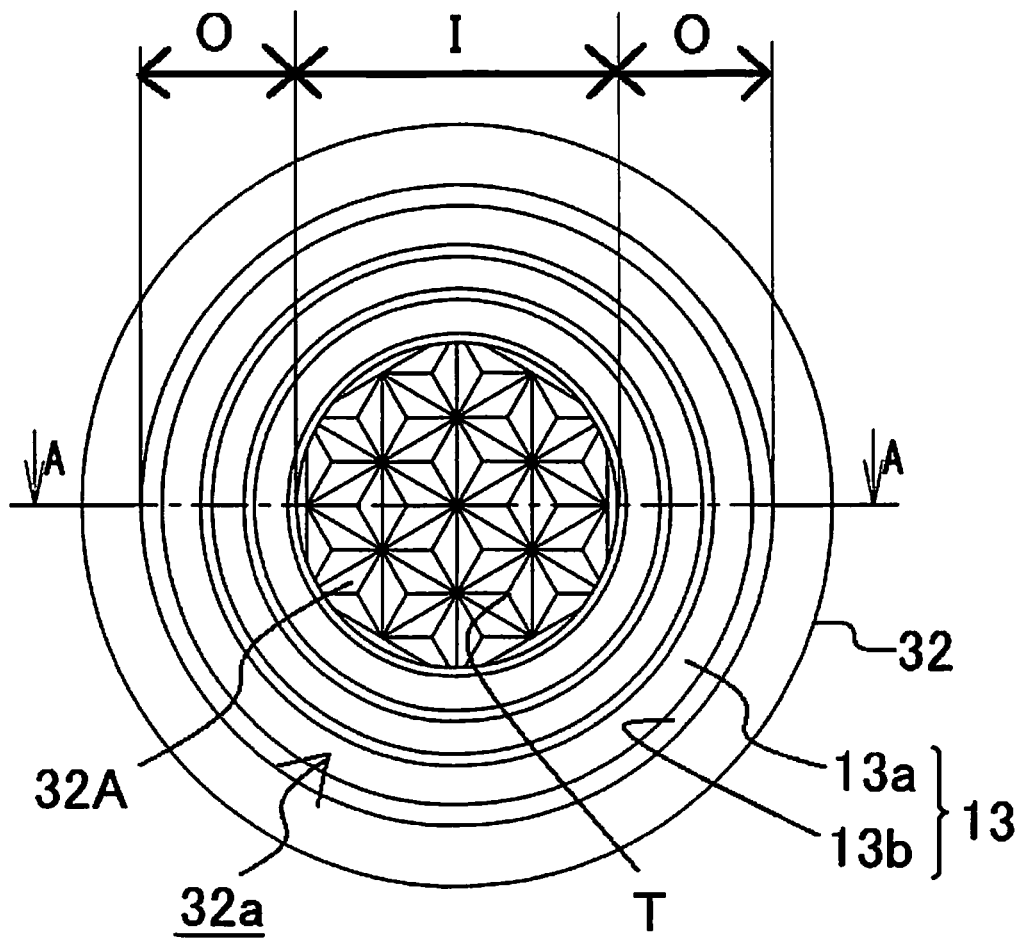
FIG. 3A is a schematic plan view of the light transmissive member in the light source device in a third embodiment of the present invention.
Figure 3B:
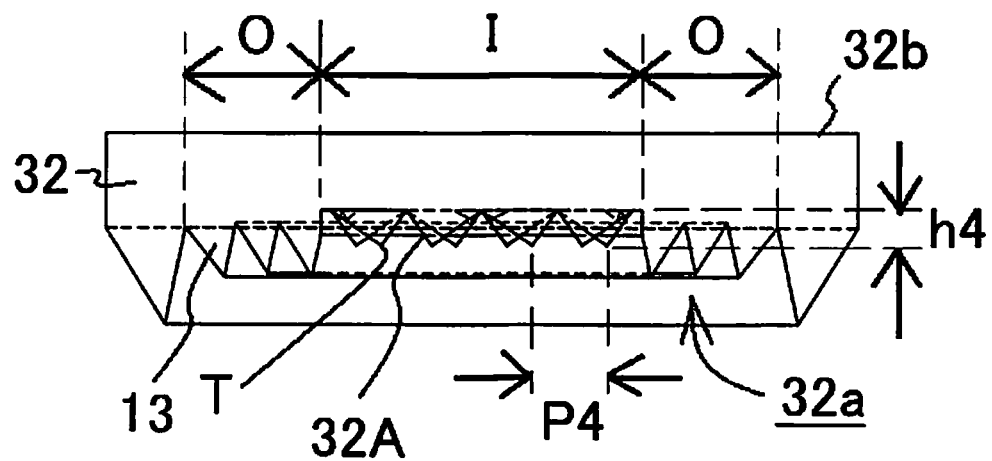
FIG. 3B is a schematic cross sectional view along the A-A' line in FIG. 3A.

As shown in FIGS. 3A and 3B, the light source device in this embodiment has substantially the same configuration as the light source device 10 in Embodiment 1, except that the surface shape of a retroreflective lens portion 32A is a half-corner cube prism (a convex shape consisting of a plurality of isosceles triangles in plan view, with the apexes of three isosceles triangles meeting at a single point). The effect is therefore the same as that of the light source device 10.

In the case that the shape of the retroreflective lens portion 32A is a convex shape such as this, then the length of one side, for example, can be suitably adjusted according to the size of the light emitting element to be used, the size of the light source device to be obtained, and so forth. For example, the pitch P4 of the convex parts is about 0.1 to 0.4 mm. Therefore, the length of one side is about 0.12 to 0.49 mm.

The apex of the convex parts (T in FIG. 3B) may be rounded.

Embodiment 4: Light Source Device

Figure 4A:
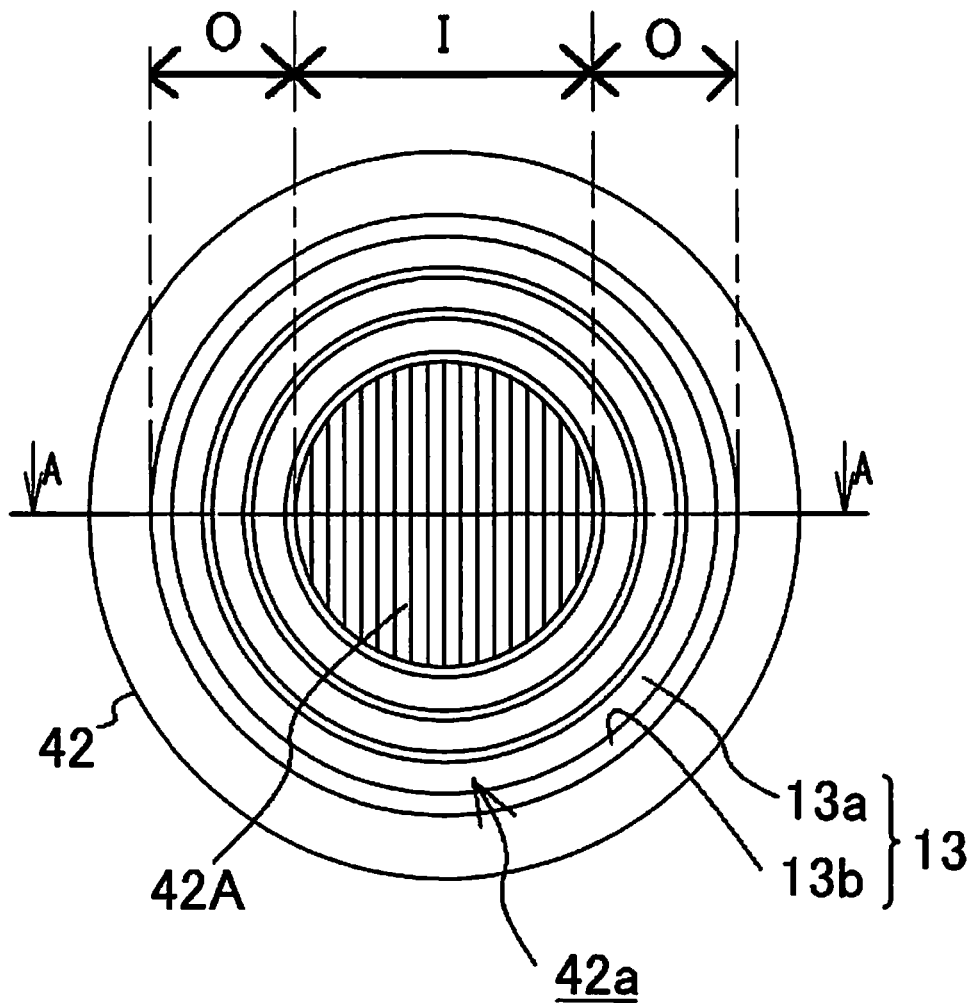
FIG. 4A is a schematic plan view of the light transmissive member in the light source device in a fourth embodiment of the present invention.
Figure 4B:
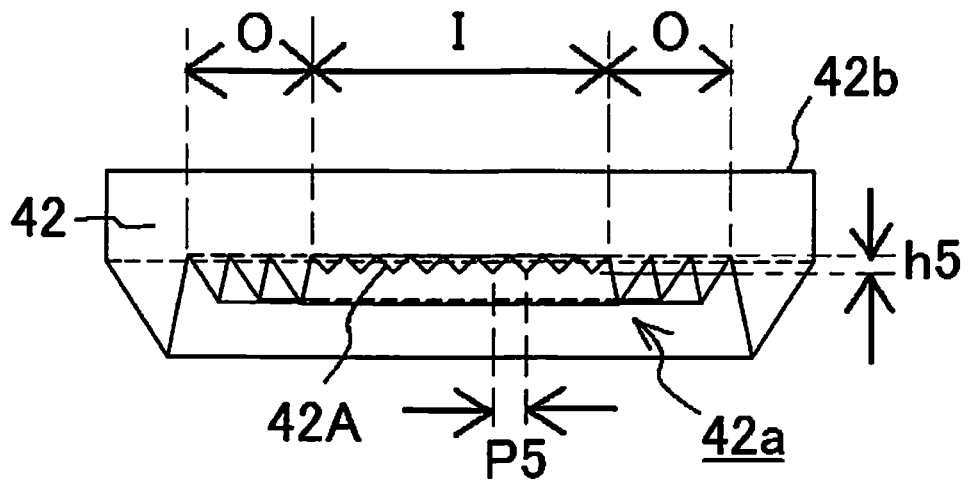
FIG. 4B is a schematic cross sectional view along the A-A' line in FIG. 4A.

As shown in FIGS. 4A and 4B, the light source device in this embodiment has substantially the same configuration as the light source device 10 in Embodiment 1, except that the surface shape of a retroreflective lens portion 42A is a convex shape that is striped in plan view and forms a 90-degree angle in cross sectional view. The effect is therefore the same as that of the light source device 10.

In the case that the shape of the retroreflective lens portion 42A is a convex shape such as this, then the height thereof, for example, can be suitably adjusted according to the size of the light emitting element to be used, the size of the light source device to be obtained, and so forth. For instance, the pitch P5 of the convex parts is about 0.05 to 0.4 mm. Therefore, the height of the convex parts (h5 in FIG. 4B) is about 0.025 to 0.2 mm.

Embodiment 5: Light Source Device

Figure 5A:
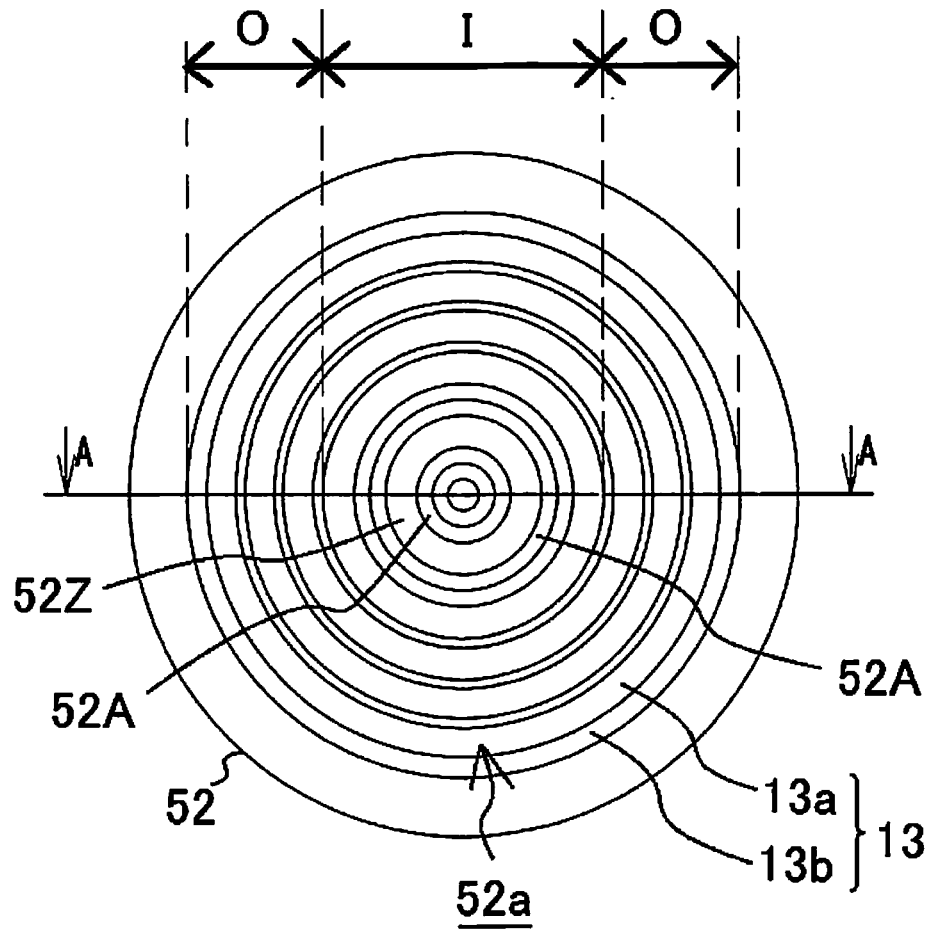
FIG. 5A is a schematic plan view of the light transmissive member in the light source device in a fifth embodiment of the present invention.
Figure 5B:
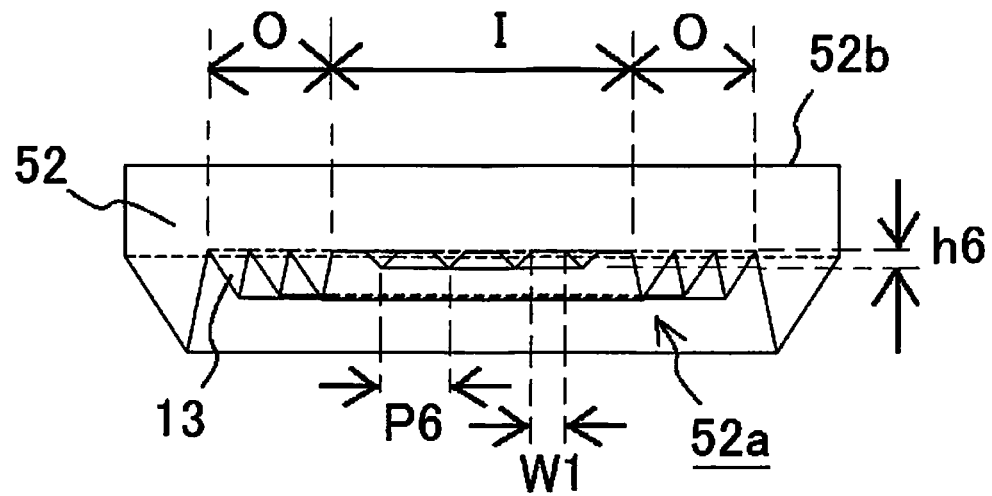
FIG. 5B is a schematic cross sectional view along the A-A' line in FIG. 5A.

As shown in FIGS. 5A and 5B, the light source device in this embodiment has substantially the same configuration as the light source device 10 in Embodiment 1, except that the surface shape of a retroreflective lens portion 52A is a shape in which prism faces of concentric circles are linked via a plane 52Z. The effect is therefore the same as that of the light source device 10.

In the case that the shape of the retroreflective lens portion 52A is a convex shape such as this, then the spacing W1 thereof, for example, can be suitably adjusted according to the size of the light emitting element to be used, the size of the light source device to be obtained, and so forth. In contrast to Embodiment 1, in the case that planes or spherical surfaces are provided between the convex parts in cross sectional view in the projected inner region I, a region without any recursive reflection can be disposed. For example, a region without any recursive reflection can be provided to 50% or less of the entire inner region I.

Embodiment 6: Light Source Device

Figure 6A:
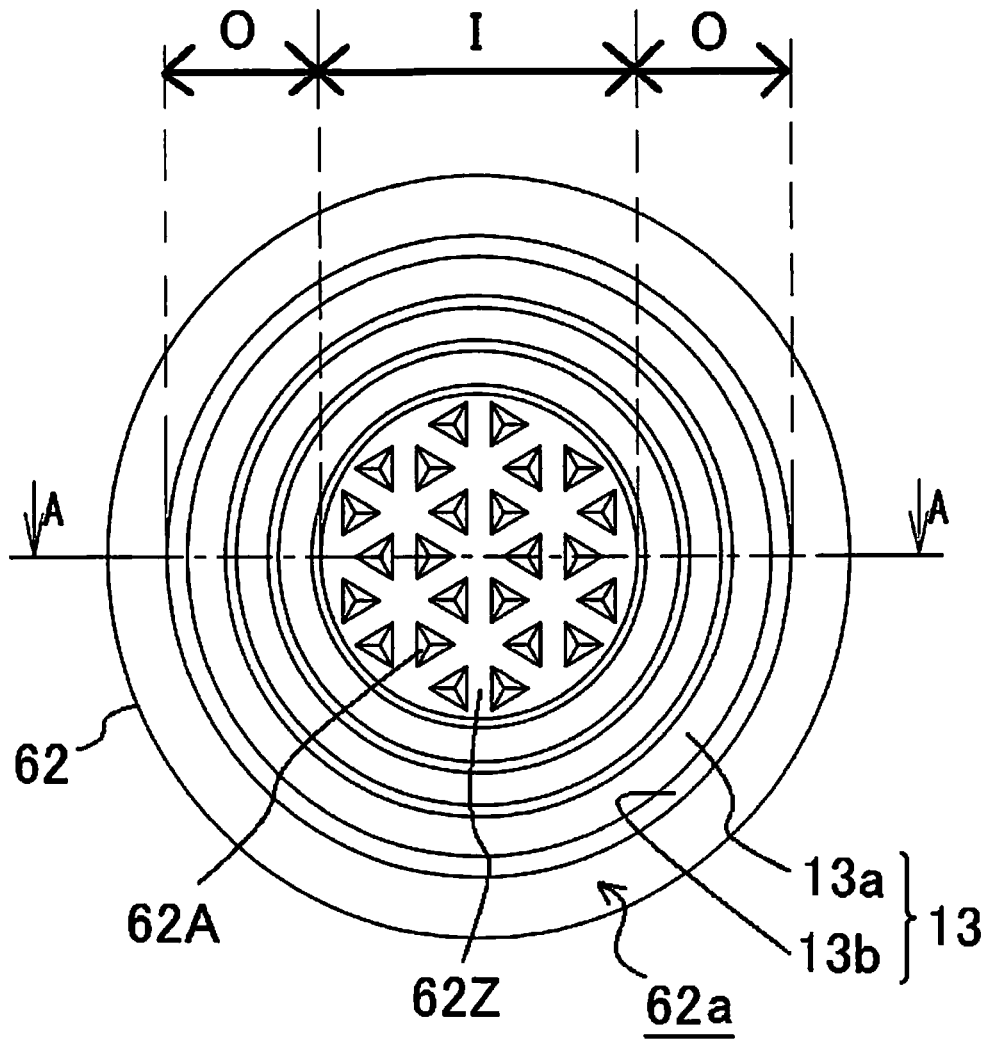
FIG. 6A is a schematic plan view of the light transmissive member in the light source device in a sixth embodiment of the present invention.
Figure 6B:
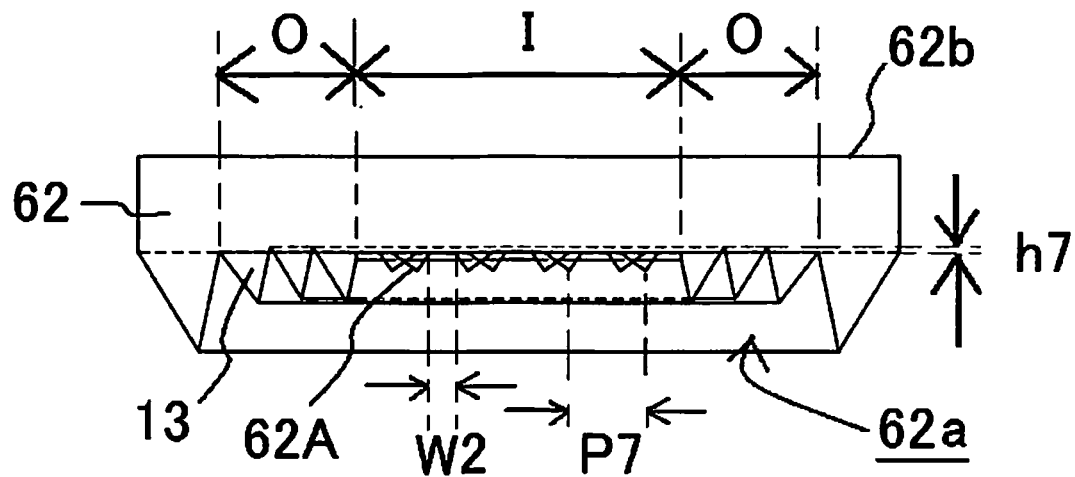
FIG. 6B is a schematic cross sectional view along the A-A' line in FIG. 6A.

As shown in FIGS. 6A and 6B, the light source device in this embodiment has substantially the same configuration as the light source device 10 in Embodiment 1, except that the surface shape of a retroreflective lens portion 62A is a shape in which half-corner cube prisms (a convex shape consisting of a plurality of isosceles triangles in plan view, with the apexes of three isosceles triangles meeting at a single point) are linked via a plane 62Z. The effect is therefore the same as that of the light source device 10.

In the case that the shape of the retroreflective lens portion 62A is a convex shape such as this, then the spacing W2, thereof, for example, can be suitably adjusted according to the size of the light emitting element to be used, the size of the light source device to be obtained, and so forth. In contrast to Embodiment 3, in the case that planes or spherical surfaces are provided between the retroreflective lens portions in the projected inner region I, a region without any recursive reflection can be disposed. For example, a region without any recursive reflection can be provided to 50% or less of the entire inner region I.

Embodiment 7: Light Source Device

Figure 9A:
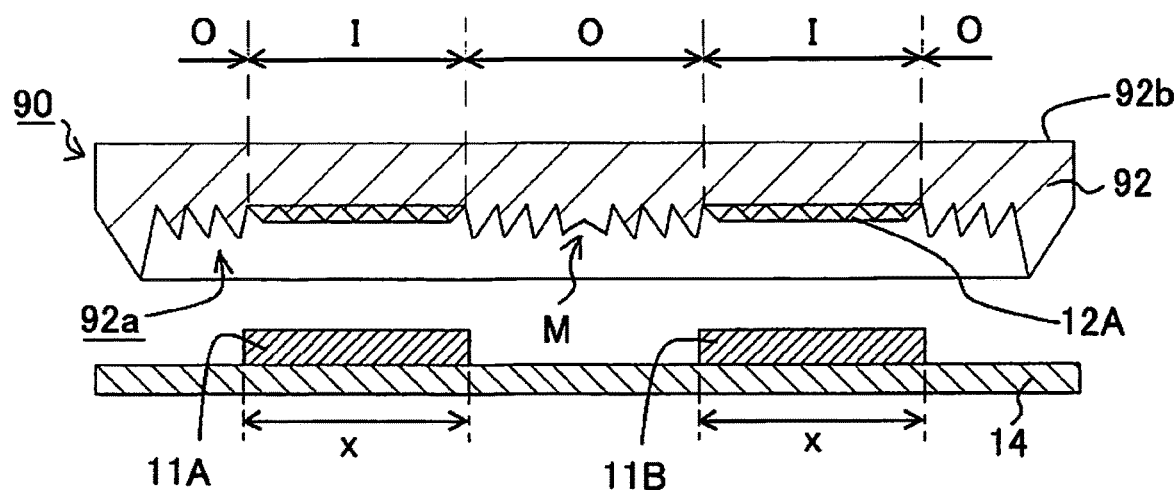
FIG. 9A is a schematic cross sectional view of the light source device in a seventh embodiment of the present invention.
Figure 9B:
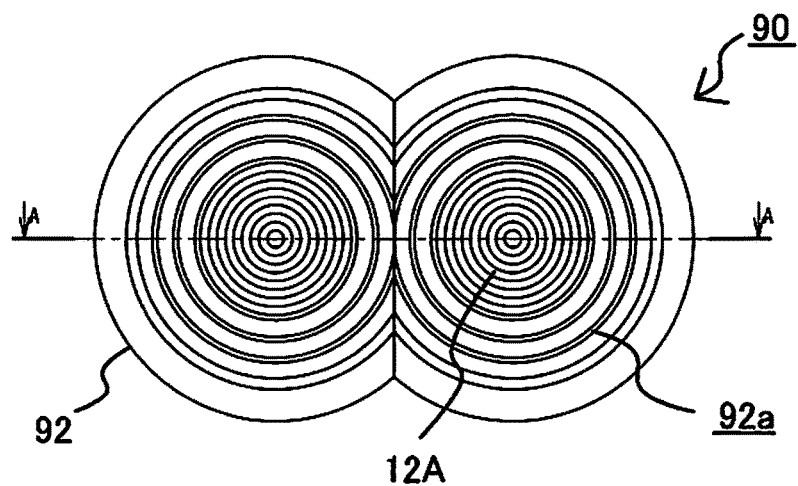
FIG. 9B is a schematic plan view of the light transmissive member in the light source device in FIG. 9A.

As shown in FIGS. 9A and 9B, the light source device 90 in this embodiment has substantially the same configuration as the light source device in Embodiment 1, except that it has two light emitting elements 11A and 11B and a light transmissive member 92.

The light transmissive member 92 has a light incidence surface 92a and retroreflective lens portions 12A, and has inner regions I that are directly across from the light emitting elements 11A and 11B, respectively, and an outer region O that has a different shape from that of the retroreflective lens portions 12A. The shape of the retroreflective lens portions 12A is the same as that of the retroreflective lens portion 12A shown in FIG. 1B.

A region that is different from the retroreflective lens portions 12A, such as a Fresnel lens M, is disposed between the two retroreflective lens portions 12A. This Fresnel lens M can direct the light emitted from the light emitting elements to the outside.

Embodiment 8: Light Source Device

Figure 10A:
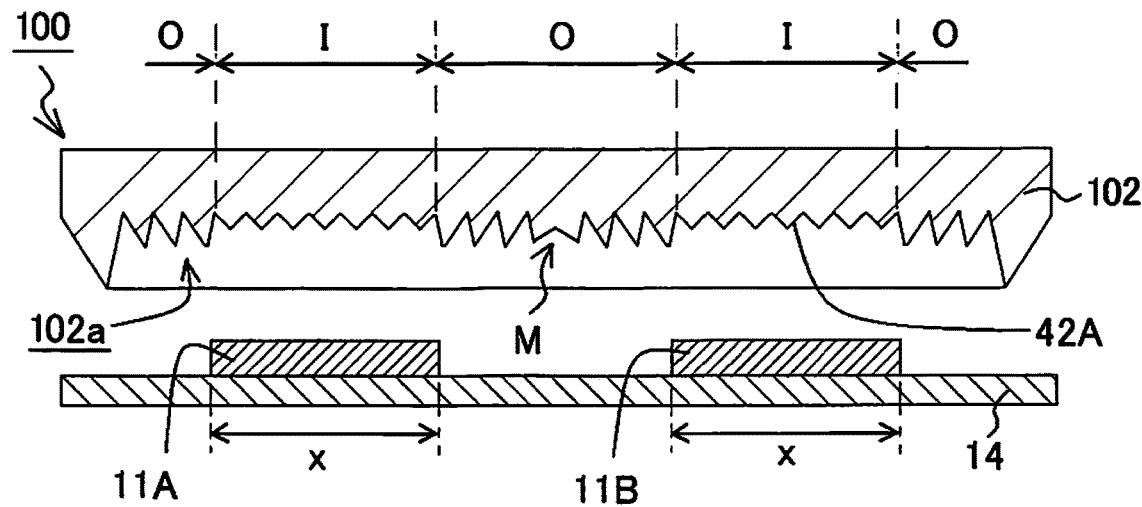
FIG. 10A is a schematic cross sectional view of the light source device in an eighth embodiment of the present invention.
Figure 10B:
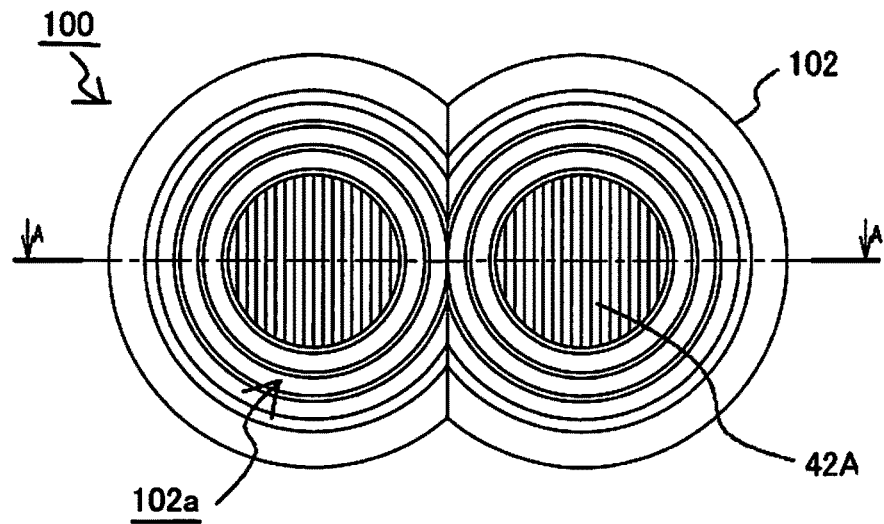
FIG. 10B is a schematic plan view of the light transmissive member in the light source device in FIG. 10A.

As shown in FIGS. 10A and 10B, the light emitting device 100 in this embodiment has substantially the same configuration as the light emitting device in Embodiment 1, except that it has two light emitting elements 11A and 11B and a light transmissive member 102.

The light transmissive member 102 has retroreflective lens portions 42A on a light incidence surface 102a, and has inner regions I that are directly across from the light emitting elements 11A and 11B, respectively, and an outer region O that has a different shape from that of the retroreflective lens portions 42A. The shape of the retroreflective lens portions 42A is the same as that of the retroreflective lens portion 42A shown in FIG. 4A.

A region that is different from the retroreflective lens portions 42A, such as a Fresnel lens M, is disposed between the two retroreflective lens portions 42A. This Fresnel lens M can direct the light emitted from the light emitting elements to the outside.

INDUSTRIAL APPLICABILITY

The light emitting device of the present invention can be used for a wide range of applications such as a camera flash, a back light source of a liquid crystal display, various lighting fixtures, various display devices (large size display, advertisement, destination guide, etc.), digital video camera, image reading devices in facsimile machines, copying machines, scanners, projector devices and various lighting for in-vehicle use.

What is claimed is:
1. A light source device, comprising:
a light emitting element; and
a light transmissive member having a light incident surface opposite to the light emitting element, and a generally planar light emitting surface,
the light incident surface including an inner region having a retroreflective lens portion and directly facing the light emitting element and on an optical axis thereof, and an outer region having a shape different from a shape of the retroreflective lens portion, the inner region of the light incident surface having a circular planar shape continuously extending throughout the inner region, a diameter of the inner region being the same as or smaller than a maximum diameter or a maximum length of one side of an emission surface of the light emitting element,
the retroreflective lens portion being configured to return light incident on a light emission surface, which is opposite from the light incident surface, back toward the light emission surface, and
the outer region being a Fresnel lens portion including a plurality of unit Fresnel lens segments arranged in a circumferential direction, each of the unit Fresnel lens segments including a lens surface and a rise surface, the Fresnel lens portion including a plurality of convex vertex portions at each of which the lens surface of one of the unit Fresnel lens segments being linked to the rise surface of an adjacent one of the unit Fresnel lens segments, the convex vertex portions being arranged on a single plane extending parallel to the light emitting surface of the light transmissive member.
2. The light source device according to claim 1, wherein the light emitting surface is roughened.
3. The light source device according to claim 1, wherein the distance between the light emitting element and the light incident surface is a half of the maximum diameter or the maximum length of one side of the emission surface of the light emitting element or less.
4. The light source device according to claim 1, wherein the distance between the light emitting element and the light emission surface is 0.2 to 1.0 mm.
5. The light source device according to claim 1, wherein the retroreflective lens portion has a concentric circular prism surface.
6. The light source device according to claim 1, wherein the retroreflective lens portion is defined by a single conical protrusion protruding toward the light emitting element.
7. The light source device according to claim 1, wherein the retroreflective lens portion is defined by a single protrusion protruding toward the light emitting element, the single protrusion having a shape of a portion of a sphere.
8. The light source device according to claim 1, wherein the retroreflective lens portion has a stripe surface shape in plan view.
9. The light source device according to claim 1, wherein the light transmissive member includes two or more retroreflective lens portions and a portion that is different from the retroreflective lens portions and is the same as the outer region in the region between the retroreflective lens portions.
10. The light source device according to claim 9, wherein the light transmissive member includes a Fresnel lens portion in a region between the retroreflective lens portions.
11. The light source device according to claim 1, wherein the retroreflective lens portion has a plurality of convex portions, each of the convex portions consisting of three isosceles triangles in plan view with apexes of the three isosceles triangles meeting at a single point.

12. The light source device according to claim 1, wherein the retroreflective lens portion has an area that is 50% or greater of a planar surface area of the inner region.

13. The light source device according to claim 1, wherein the retroreflective lens portion has a plurality of concentric circular prism surfaces continuously linked to each other, with each of the prism surfaces meets at 90-degree angles with an adjacent one of the prism surfaces.

14. The light source device according to claim 13, wherein a height of each of the concentric circular prism surfaces is in a range of about 25 to 150 μm.

* * * * *